United States Patent [19]

Faulk

[11] Patent Number: 5,177,371
[45] Date of Patent: Jan. 5, 1993

[54] AUXILIARY BATTERY OPERATION DETECTION CIRCUIT

[75] Inventor: Richard A. Faulk, Cypress, Tex.

[73] Assignee: Compaq Computer Corporation, Houston, Tex.

[21] Appl. No.: 596,476

[22] Filed: Oct. 12, 1990

[51] Int. Cl.[5] .............................................. H02J 9/04
[52] U.S. Cl. ..................................... 307/66; 307/150; 307/48; 340/636
[58] Field of Search ............................. 307/48, 64–68, 307/150; 365/226–229; 371/66, 14, 16.3; 340/660–663, 636; 364/185, 186, 707

[56] References Cited

U.S. PATENT DOCUMENTS

| | | | |
|---|---|---|---|
| 4,451,742 | 5/1984 | Aswell | 307/66 |
| 4,528,459 | 7/1985 | Wiegel | 307/66 |
| 4,709,318 | 11/1987 | Gephart et al. | 307/66 X |
| 4,860,185 | 8/1989 | Brewer et al. | 307/66 X |
| 4,965,462 | 10/1990 | Crawford | 307/66 |
| 4,965,828 | 10/1990 | Ergott, Jr. et al. | 307/64 X |

Primary Examiner—A. D. Pellinen
Assistant Examiner—Fritz M. Fleming
Attorney, Agent, or Firm—Pravel, Gambrell, Hewitt, Kimball & Krieger

[57] ABSTRACT

A power supply which senses whether a primary battery is discharging to below a predetermined dead battery level or the primary battery has been removed and the system is operating from an auxiliary battery, which has a lower voltage. When the battery voltage goes below the dead voltage level, the system is in a low power mode and the power supply output voltages are satisfactory, a timer may be started. If the battery voltage does not drop to the auxiliary battery voltage level within a predetermined time, a shutdown signal is generated and the power supply ceases providing output voltage levels. In this manner the primary battery can be removed and the system can continue running on the auxiliary battery until a charged primary battery is installed and yet the primary battery discharge rate will be greatly slowed when the primary battery voltage is below a given level and the primary battery is still installed in the system.

14 Claims, 8 Drawing Sheets

AUXILIARY BATTERY OPERATION DETECTION CIRCUIT

BACKGROUND OF THE INVENTION

1. Field of the Invention

The present invention generally relates to battery powered electronic devices, and more particular, to electronic devices having primary and auxiliary battery supplies of differing voltages.

2. Description of the Related Art

Battery powered personal computers are becoming very popular, particular as the computers get smaller and smaller. This makes them highly portable so that they can be used in practically any location, often quite far from sources of electrical power. This possible inaccessibility of power means that long term battery operation is very important. When going to a remote location it is common to utilize several sets of additional batteries which have been charged prior to leaving the source of available power. As a battery discharges, it is replaced with a charged battery and operations can continue. In this manner the total operating time of the computer before a power down or loss of power situation can greatly exceed that of a single battery.

However, one problem that can occur in the battery changing situation is that the user may not be able to save the information present in the computer when the battery needs to be replaced and before the battery reaches a dead battery level. That is, the battery may need to be replaced but the computer may be in the middle of an operation which cannot be interrupted. In these cases any data present in the memory of the computer would be lost when the dead battery level is reached and any operations would have to be completely reinitiated and any data reentered. This is obviously an undesirable condition. To this end the computer system may contain a smaller, low power auxiliary battery which is not capable of providing energy to a fully operating unit, but can operate a temporary power source if the computer is in a standby or low power mode. The use of the auxiliary battery allows the primary battery to be replaced Without loss of data to the computer system. The use of the auxiliary battery thus allows for extended operation of the computer system without loss of data.

Typically the auxiliary battery will have a lower output voltage than the primary battery. The auxiliary battery preferably is very small and so fewer individual cells are used to form the auxiliary battery, resulting in this lower voltage. However, the computer system contains battery voltage monitoring circuitry to shut down the power supply, and consequently the computer, to prevent damage to the primary battery by deeply discharging the battery and to the computer should a primary battery having too low of a voltage be installed. The voltage of the auxiliary battery is well into the region that would normally be considered dead or fully discharged if the primary battery was active. Yet the auxiliary battery is fully operational and the computer system can continue to operate in the standby mode. Thus the battery voltage monitoring circuitry in the computer system must be able to determine when the primary battery is going dead or when it has been removed and operation is being continued on the auxiliary battery.

SUMMARY OF THE INVENTION

In a computer system embodying the present invention a DC-DC power supply utilized in the computer system monitors the battery voltage and produces proper operating voltages for the computer system. If the voltage level from the batteries is in the discharged or dead voltage range of the primary battery and the computer system is in standby mode, a timer is started timing this entry into the low voltage state. If the battery voltage drops to the level of the auxiliary battery before the timer's period has elapsed, auxiliary battery operation is proper because this is an indication that the primary battery has been removed, the voltage change being abrupt. If the battery voltage is to slowly sag or drop, this is an indication that the primary battery is still present and is further discharging. This is a case to shut down the power supply and the computer system. Therefore if the battery voltage is still above the auxiliary battery level after the timer completes, the power supply shuts down and no auxiliary battery operation is indicated. Thus by waiting for an interval after entry into a dead primary battery state before shutting down, the switchover to the auxiliary batteries can be detected and computer system operation continued.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
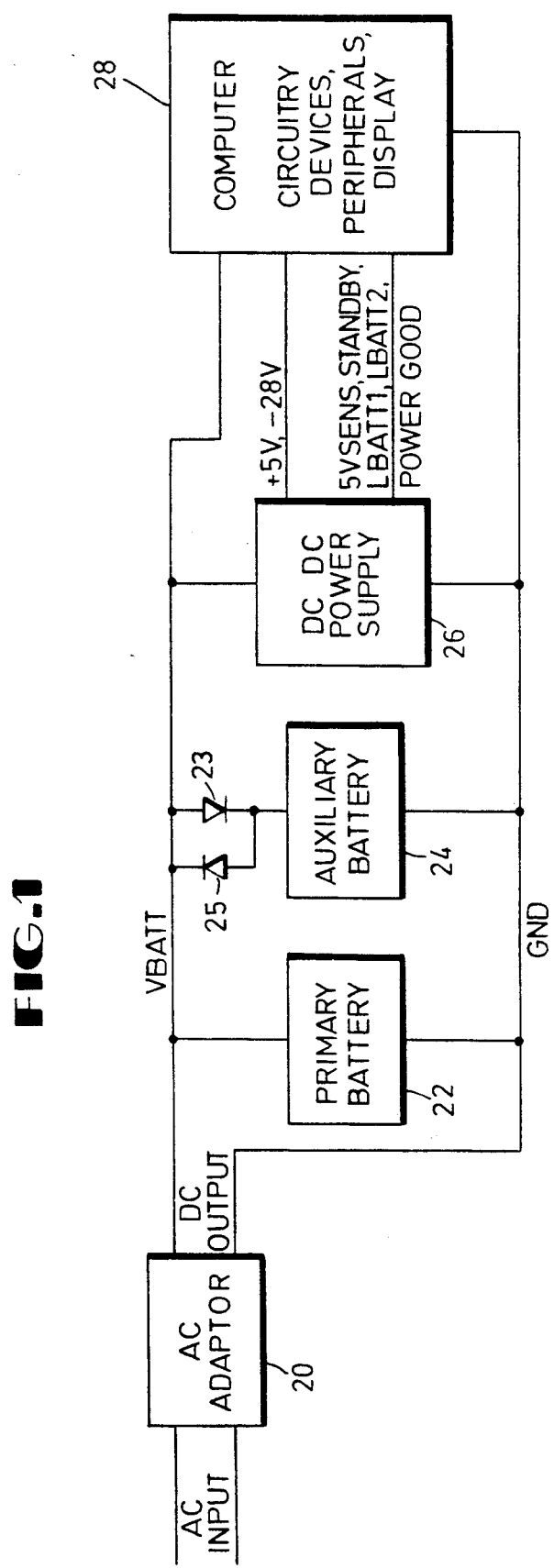
FIG. 1 is a block diagram of a computer system incorporating the present invention.

Referring now to FIG. 1, a battery powered computer system is generally shown. An AC adaptor 20 is connected into an AC input, which is typically available from the wall or other conventional source, and provides a DC output voltage, preferably in the range of 16.8 to 26 volts. The lines or signals provided by the AC adaptor 20 are referred to as $V_{BATT}$ line and ground, representing the positive and ground voltage supply lines. Connected between the $V_{BATT}$ line and ground is a primary battery 22 and a DC-DC power supply 26. An auxiliary battery 24 has its negative terminal connected to ground and its positive terminal connected to the cathode of a current limiting diode 23 and the anode of a diode 25. The anode of the current limiting diode 23 and the cathode of the diode 25 are connected to the $V_{BATT}$ line. The current limit diode 23 prevents the auxiliary battery 24 from overcharging and the diode 25 allows the auxiliary battery 24 to deliver power. Additionally, the remaining portions of the computer 28 receive the $V_{BATT}$ and ground signals for providing certain levels of power. The primary battery 22 in the preferred embodiment has an operating voltage between 16.8 and 26 volts, while the auxiliary battery 24 has an operating voltage between 8 and 14 volts. Both the primary battery 22 and the auxiliary battery 24 are comprised of a plurality of individual cells of desired capacity and voltage. Preferably the primary battery 22 is much larger than the auxiliary battery 24, which can supply only low amounts of power for short intervals. The DC-DC power supply 26 converts the voltage it receives on the $V_{BATT}$ line to a +5 volt line, which is the primary operating voltage for circuitry in the computer 28, and a −28 volt line, which is used by the liquid crystal display in the preferred embodiment of the computer 28. The DC-DC power supply 26 provides the LBATT1, LBATT2 and POWERGOOD signals to the computer 28 to inform it of voltage status. A STANDBY signal is provided from the computer 28 to the DC-DC power supply 26 to indicate standby or low power operation. Additionally, a 5VSENS signal, the 5 volt sense signal, is returned from the computer 28 to the DC-DC power supply 26 so that the actual regulation point for the +5 V line is closer to the load as desired by the computer system designer and is not simply the voltage present at the DC-DC power supply 26.

Figure 2:
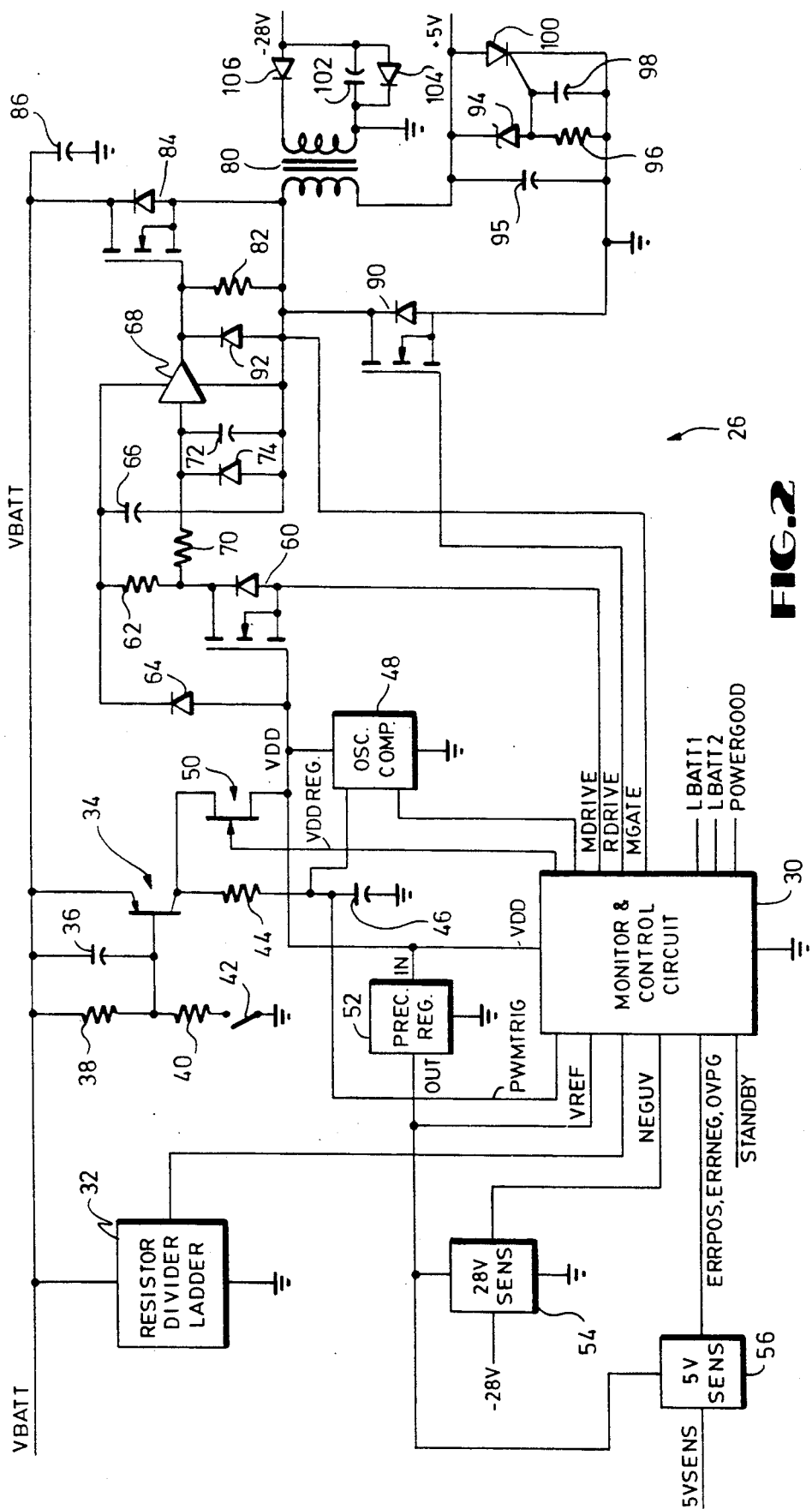
FIG. 2 is a schematic diagram of the DC-DC power supply of the computer system of FIG. 1.

Referring now to FIG. 2, the DC-DC power supply 26 is generally shown. A monitor and control circuit 30 is used to control operation of the DC-DC power supply 26. This monitor and control circuit 30 is preferably a single CMOS integrated circuit for lower power consumption, flexibility of design and space saving. A resistor divider ladder 32 is connected between the $V_{BATT}$ line and ground and provides a series of different voltage levels to the monitor and control circuit 30 to allow monitoring of various battery levels against a single reference voltage in the monitor and control circuit 30. The emitter of a power supply turn on PNP transistor 34 is connected to the $V_{BATT}$ line. A capacitor 36 is connected between the base of the transistor 34 and the $V_{BATT}$ line to provide noise and switching decoupling. A resistor 38 is connected between the $V_{BATT}$ line and the base of the transistor 34, with a resistor 40 connected between the base of the transistor 34 and one terminal of a power switch 42. The second terminal of power switch 42 is connected to ground, so that when the switch 42 is closed, the transistor 34 is activated, allowing power to be transmitted to the remaining portions of the power supply circuitry. Thus in this fashion the power switch 42 is used to turn off and turn on the DC-DC power supply 26 and thus the computer 28.

The collector of the power supply turn on transistor 34 is connected to one terminal of a resistor 44 whose second terminal is connected to a PWMTRIG input of the monitor and control circuit 30. A capacitor 46 is connected between the PWMTRIG input and ground to provide a delay. The PWMTRIG input is used to indicate that power is now being provided and the computer 28 is to be turned on. The PWMTRIG input signal is also provided to the input of an oscillator components block 48. The monitor and control circuitry 30 includes a pulse width modulated power supply circuit for generating the control signals used in the DC-DC power supply 26. To this end, various oscillator components, such as resistors and capacitors, are needed to help provide a basic clocking signal to the PWM circuitry. The oscillator components 48 are also connected to a line or signal referred to as $V_{DD}$, the power supply voltage for this portion of the DC-DC power supply 26, and to ground.

An n-channel junction field effect transistor (JFET) 50 has its drain connected to the collector of the power supply turn on transistor 34 and its source provides the $V_{DD}$ signal, the controlled voltage for this portion of the circuitry. The gate signal to the JFET 50 is provided by an output referred to as the $V_{DD}$REG output or $V_{DD}$ regulator control output which is provided by the monitor and control circuit 30.

The $V_{DD}$ signal is provided to the monitor and control circuit 30 for powering its operation and is additionally provided to the input of an adjustable low power regulator 52, such as an LP-2951 by National Semiconductor. The output of the regulator 52 is referred to as the VREF signal, which is provided to the monitor and control circuit 30 to be used as a reference voltage in comparing the various voltages developed by the resistor divider ladder 32. Additionally, the VREF signal is provided as an input to the 28 volt sense circuitry 54, which also receives a −28 volt signal which is produced by the DC-DC power supply 26. Further, the 28 volt sense circuitry 54 is connected to ground and produces a signal referred to as NEGUV, or negative undervoltage, which is provided to the monitor and control circuit 30 for indication of a negative output undervoltage condition.

The VREF signal is provided as a comparison input to the 5 volt sense circuitry 56, which also receives the 5VSENS signal from the computer 28. The 5 volt sense circuitry 56 provides three signals to the monitor and control circuit 30, these signals being the ERRPOS, ERRNEG and OVPG or positive error, negative error and overvoltage signals for use by the monitor and control circuit 30 in controlling output pulse width and determining 5 volt output overvoltage and undervoltage conditions. The monitor and control circuit 30 also receives a STANDBY signal from the computer 28 to indicate that the computer system has entered a low power mode used to conserve battery life.

The monitor and control circuitry 30 produces three signals based on the level of the $V_{BATT}$ line and operation of the DC-DC power supply 26. These signals are referred to as LBATT1, LBATT2 and POWERGOOD. The LBATT1 and LBATT2 signals represent the primary battery 22 entering first and second low battery level states, which are respectively low and lower voltages. The POWERGOOD signal is an indication that the DC-DC power supply 26 is operating properly and that proper voltage levels are being provided to the computer 28.

The $V_{DD}$ signal is provided to the gate of n-channel enhancement mode power MOSFET 60. The source of the MOSFET 60 is connected to the MDRIVE signal provided by the monitor and control circuit 30, which is a control signal used to switch one portion of the switching power supply used in the DC-DC power supply 26. One terminal of a resistor 62 is connected to the drain of the MOSFET 60. The second terminal of the resistor 62 is connected to the cathode of a diode 64, whose anode is connected to the $V_{DD}$ line. Also connected to the cathode of the diode 64 is one terminal of a capacitor 66 and the power supply input for a buffer driver 68. The signal input of the buffer driver 68 is connected to one terminal of a resistor 70, whose other terminal is connected to the drain of the MOSFET 60.

The ground reference of the buffer driver 68 is connected to it the second terminal of the capacitor 66, one terminal of a capacitor 72 and the anode of a diode 74. The cathode of the diode 74 and the second terminal of the capacitor 72 are connected to the input of the buffer driver 68. The local ground reference for the buffer amplifier 68 is connected to a first terminal of a primary winding of a transformer 80. A resistor 82 is connected between this transformer winding terminal and the output of the buffer driver 68. The output of the buffer driver 68 is further connected to the gate of a n-channel enhancement power MOSFET 84. The drain of the MOSFET 84 is connected to the $V_{BATT}$ line, with a filter capacitor 86 connected between the $V_{BATT}$ signal and ground to provide local filtering for the DC-DC power supply 26. The source of the MOSFET 84 is connected to the first terminal on the primary of the transformer 80 to provide the switching component to allow energy to flow from the batteries into this leg of the transformer 80. The cathode of a diode 92 is connected to the gate of the MOSFET 84, with the anode connected to an MGATE signal provided to the monitor and control circuit 30. The MGATE signal is used to provide feedback on the output pulse control state.

The final component connected to this first terminal of the primary winding of the transformer 80 is the drain of an n-channel enhancement power MOSFET 90. The gate of the MOSFET 90 receives the RDRIVE signal produced by the monitor and control circuit 30, which is effectively the inverse of the MDRIVE signal when the power supply is operating. The source of the MOSFET 90 is connected to ground.

The second terminal of the primary winding of the transformer 80 is considered to be the +5 volt line and is connected to a capacitor 92 which has its other terminal connected to ground. The cathode of a Zener diode 94 is connected to the +5 volt line, while the anode of the Zener diode 94 is connected to one terminal of a resistor 96, one terminal of a capacitor 98 and the gate of a silicon controlled rectifier (SCR) 100. The second terminals of the resistor 96 and capacitor 98 are connected to ground. The anode of the SCR 100 is connected to the +5 volt line, while the cathode of the SCR 100 is connected to ground. The Zener diode/SCR circuitry provides an overvoltage clamping circuit on the +5 V output for protection.

The secondary winding of the transformer 80 produces the −28 volt signal. One terminal of the secondary winding is connected to ground, along with a capacitor 102 and the cathode of a diode 104. The second terminal of the capacitor 102 and the anode of the diode 104 are connected to the −28 volt line, with the anode of a diode 106 also being connected to this line. The cathode of the diode 106 is connected to the second terminal of the secondary winding of the transformer 80. Thus this second winding provides a simple rectified −28 volt output for use by the computer 28.

Figure 3:
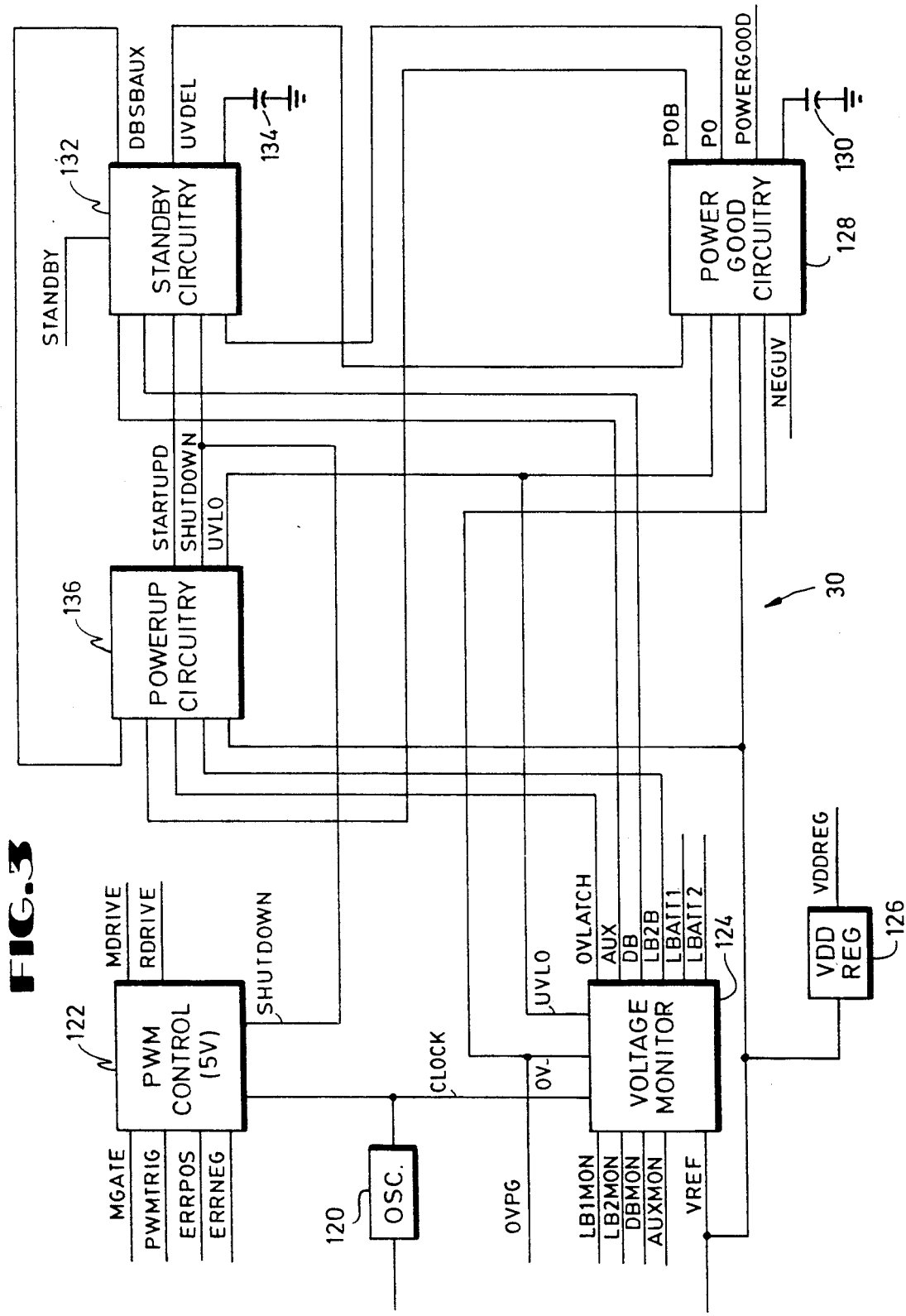
FIG. 3 is a block diagram of the monitor and control circuit of FIG. 2.

Referring now to FIG. 3, the monitor and control circuit 30 is shown in more detail. The signals from the oscillator components 48 are connected to an oscillator 120. The oscillator 120 produces a clock signal referred to as CLOCK. This CLOCK signal is provided to a PWM control module 122. The pulse width modulation (PWM) control module 122 receives the MGATE signal, the PWMTRIG signal, the ERRPOS signal and the ERRNEG signal to control its operations and provides the MDRIVE and RDRIVE signals to the transistors 60 and 90. Additionally, the PWM control module 122 receives a signal referred to as SHUTDOWN which disables operation of the PMW control module 122 when in a high state.

The CLOCK signal is also provided as one input to a voltage monitor circuit 124. Other inputs to the voltage monitor circuit include the LB1MON, LB2MON, DBMON and AUXMON signals, which are provided as the outputs of the resistor divider ladder 32. These signals refer, respectively, to the first low battery voltage level, the second lower battery voltage level, the dead or discharged battery voltage level and the auxiliary battery voltage level as appropriately divided for comparison with the VREF signal, which is an additional input to the voltage monitor 124. The OVPG signal developed by the 5 volt sense circuitry 56 is an input to the voltage monitor 124 so that certain signals can be disabled or latched as appropriate. The UVLO signal is a further input relating to undervoltage conditions and is high when not undervoltage. Outputs of the voltage monitor 124 include the LBATT1 and LBATT2 signals, which are provided to the computer system 28; a signal referred to as LB2B, which is an inverted version of the LBATT2 signal; the DB signal, which when high indicates a dead battery level; the AUX signal, which when high indicates that a voltage above that of a fully charged auxiliary battery level is present; and the OVLATCH signal or overvoltage latched signal.

The VREF signal is additionally provided to the $V_{DD}$ voltage regulator 1126 which produces the $V_{DD}REG$ signal to activate the JFET 50 to allow control of the $V_{DD}$ signal level.

The VREF signal is additionally an input to the power good circuitry 128. Other inputs to the power good circuitry 128 are the NEGUV signal, the OVPG signal, the UVLO signal and a signal referred to as UVDEL, which indicates when high that an undervoltage delay period has completed. The outputs of the power good circuitry 128 are the POWERGOOD signal, which is provided to the computer 28 to indicate that a stable and satisfactory 5 volt signal is present; the PO signal, which an internal version of the POWERGOOD signal; and the POB signal, which is a latched version of the PO signal and indicates when high that valid power is present. A capacitor 130 is connected between the power good circuitry 128 and ground for use in developing a timing delay for developing the POWERGOOD signal.

The PO signal is provided as one input to the standby circuitry 132. Other inputs to the standby circuitry 132 are the STANDBY signal as received from the computer 28, the AUX signal, the DB signal, a signal referred to as STARTUPB, which indicates that a start up sequence is in operation and the SHUTDOWN signal. The outputs of the standby circuitry 132 are the DBSBAUX signal, which indicates a dead battery, standby and auxiliary situation; and the UVDEL signal, which when high indicates that the undervoltage delay has been completed. Additionally, a capacitor 134 is connected between ground and the standby circuitry 132 to provide a delay period used in developing the UVDEL signal and timing to control the auxiliary switchover signals.

The STARTUPB, SHUTDOWN and UVLO signals are developed by power up circuitry 136. The inputs to the power up circuitry 136 are the POB signal, the OVLATCH signal, the LB2B signal, the VREF signal and the DBSBAUX signal.

Figure 4:
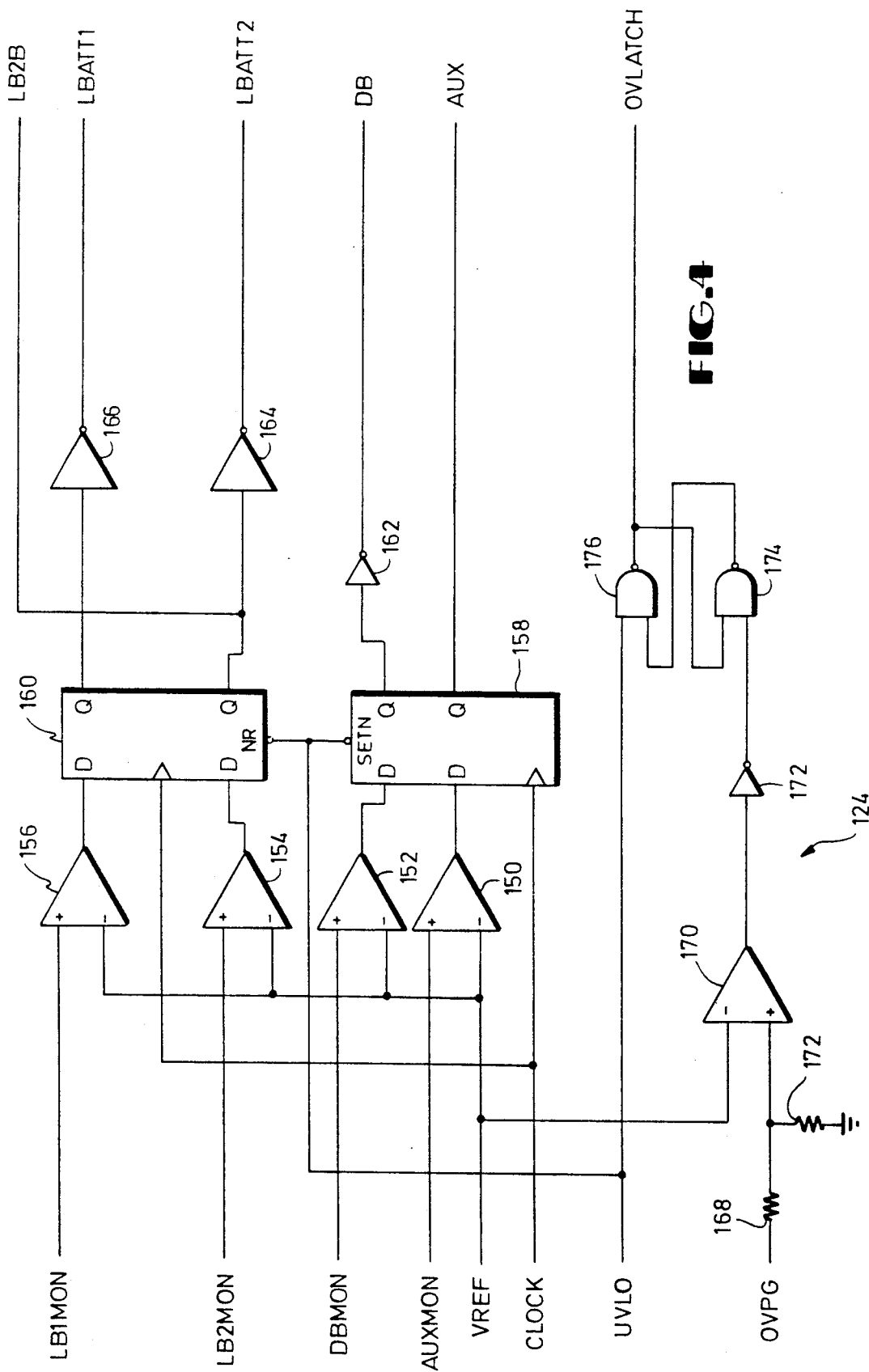
FIG. 4 is a schematic diagram of portions of the circuitry of the voltage monitor circuitry of FIG. 3.

These various modules are explained in more detail in the following figures and description. Referring to FIG. 4, the voltage monitor circuitry 124 is shown in more detail. The VREF signal is connected to the inverting input of 4 comparators 150, 152, 154 and 156. These comparators 150, 152, 154 and 156 are used to compare against the monitoring voltages received from the resistor divider ladder 32. The LB1MON signal is connected to the noninverting input of the comparator 156, while the LB2MON signal is connected to the noninverting input of the comparator 154. The DBMON signal is provided to the noninverting input of the comparator 152, while the AUXMON signal is provided to the noninverting input of the final comparator 150. The LB1MON signal voltage division from the $V_{BATT}$ line is set such that when the primary batteries are discharged to a first level, the output of the comparator 156 goes low. Similarly, the LB2MON signal level is divided from the VBATT line such that when the batteries have discharged to a second level, which is lower than the LB1MON level, the output of the comparator 154 goes to a low level. Similarly, when the DBMON signal is below a given level which is indicative of a dead primary battery 22, for example 16.8 volts in the preferred embodiment, the output of the comparator 152 goes to a low level. Finally, when the $V_{BATT}$ signal goes below a lower value which is indicative of the auxiliary battery 24 operation, the AUXMON signal has a value less then the VREF signal and the output of the comparator 150 goes low.

The outputs of the comparators 150, 152, 154 and 156 are connected to the D inputs of two 2 bit D-type flip-flops 158 and 160. The CLOCK signal from the oscillator 120 is provided as the clocking input to both flip-flops 158 and 160. The UVLO signal is connected to the inverted reset input of the flip-flop 160, while the UVLO signal is connected to the inverted set input of a flip-flop 158. In the particular preferred embodiment, the noninverted outputs of the flip-flops 158 and 160 are utilized. Thus the noninverted output of the flip-flop 158 corresponding to the D input receiving the output of the comparator 150 is the AUX signal, so that the AUX signal is high when the $V_{BATT}$ line level is above that at which the auxiliary battery 24 is expected to be operating. The noninverted output of the flip-flop 158 corresponding to the D input receiving the output of comparator 152 is connected to an inverter 162, whose input is the DB or dead battery signal. Therefore when the primary battery 22 is above the level which is considered to be fully discharged or dead, the DB signal is low, and is high when the battery 22 is considered discharged. The noninverted output of flip-flop 160 corresponding to the D input connected to the comparator 154 is considered to be the LB2B signal and is connected to the input of an inverter 164. The output of the inverter 164 is the LBATT2 signal, so that when it is high, the primary battery 22 condition is at or below the second low voltage level. The noninverted output of the flip-flop 160 corresponding to the D input receiving the output of the comparator 156 is provided to the input of an inverter 166 whose output is the LBATT1 signal. Thus when the LBATT1 signal is high the primary battery 24 is below the first low voltage level. Therefore the divided battery voltage is received at the inputs of the comparators 150-156, compared with the VREF signal, periodically latched into a series of flip-flops 158 and 160 to allow relatively stable signals to be developed, and inverted if appropriate.

The OVPG signal is connected to one terminal of a resistor 168. The second terminal of the resistor 168 is connected to the noninverting input of a comparator 170. A resistor 172 is connected between the noninverting input of the comparator 170 and ground, thus forming a resistor divider with resistor 168. The VREF signal is provided to the inverting input of the comparator 170 so that when the level of the OVPG signal as provided by the 5 volt sense circuitry 56 indicates that the 5 volt level is too high, the output of the comparator 170 is at a high level. The output of the comparator 170 is connected to the input of an inverter 172. The output of the inverter 172 is connected to one input of a 2 input NAND gate 174. The output of the NAND gate 174 is provided to one input of a 2 input NAND gate 176. The output of the NAND gate 176 is connected to the second input of the NAND gate 174 and is referred to as the OVLATCH signal so that when an overvoltage condition does occur it is latched in by the latch formed by the NAND gates 174 and 176 and the OVLATCH signal stays set until an undervoltage condition occurs. The UVLO signal is provided as the second input to the NAND gate 176 so that the OVLATCH signal is high when an undervoltage condition occurs and until the next overvoltage condition occurs.

Figure 5:
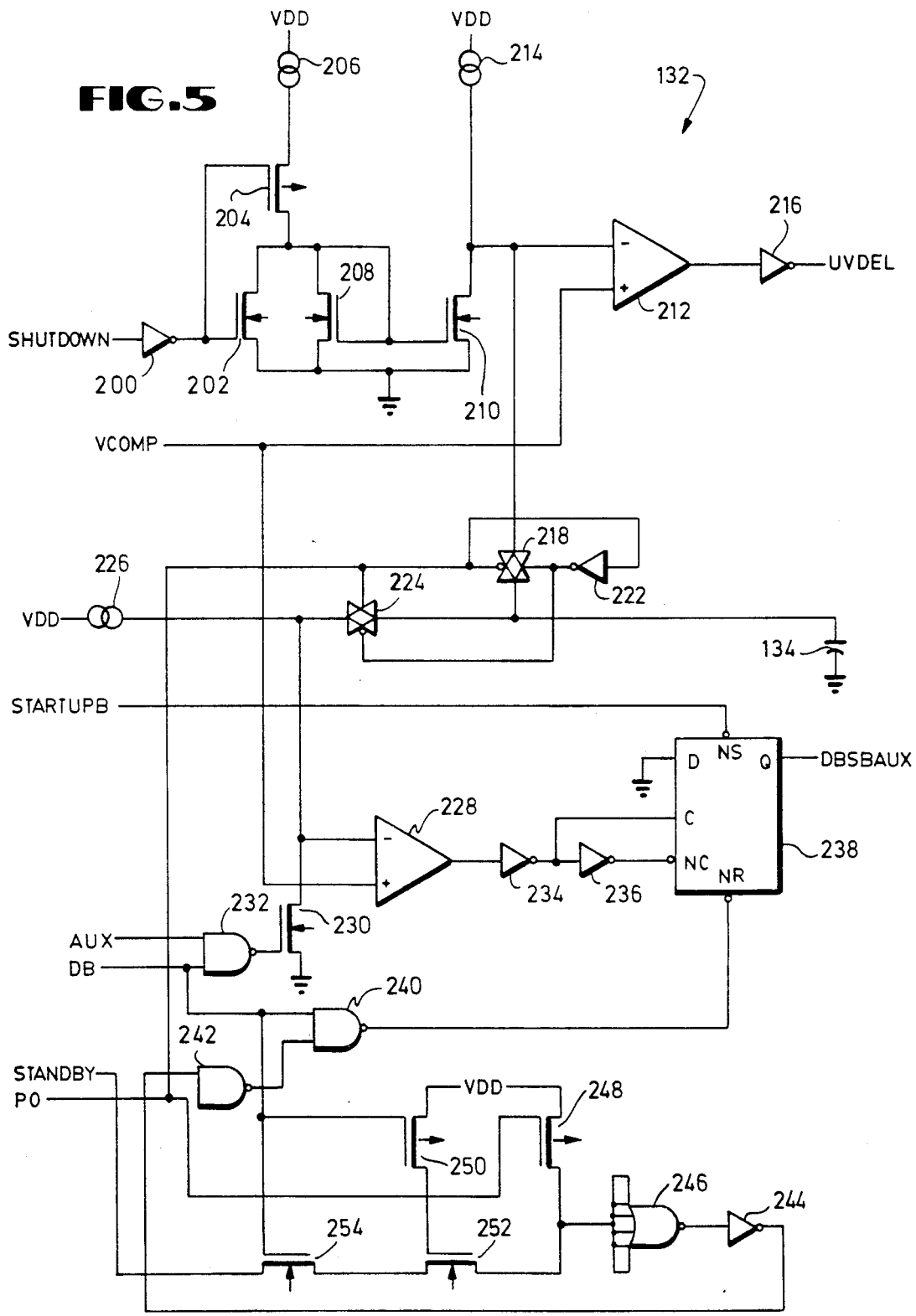
FIG. 5 is a schematic diagram of portions of the standby circuitry of FIG. 3.

Referring now to FIG. 5, the standby circuitry 132 is shown in more detail. The SHUTDOWN signal indicating that the 5 volt power supply should be shut down is provided as the input to a inverter 200. The output of the inverter 200 is connected to the gate of an n-channel enhancement MOSFET 202 and to the gate of a p-channel enhancement MOSFET 204. The drain of the MOSFET 204 is connected to a constant current source 206 which is connected to the $V_{DD}$ line. The source of the MOSFET 204 is connected to the drain of the MOSFET 202, to the drain of an n-channel enhancement MOSFET 208 and to the gates of the MOSFET 208 and an n-channel enhancement MOSFET 210. The sources of the MOSFET's 202, 208 and 210 are connected to ground. The drain of the MOSFET 210 is connected to the inverting input of a comparator 212 and to the output of a current source 214. The current source is connected to the $V_{DD}$ line for power. Thus in this manner if the SHUTDOWN signal is not received, the MOSFET 204 is turned off and the MOSFET 202 is turned on, so that the MOSFET 210 is turned off and the inverting input of the comparator 212 is not clamped to ground.

The noninverting input of the Comparator 212 is connected to a reference voltage referred to as $V_{COMP}$ which is used in the standby circuitry 132. The output of the comparator 212 is connected to an inverter 214 whose output is the UVDEL signal. The inverting input of the comparator 212 is also connected to one through terminal of a transfer gate 218. The second through terminal of the transfer gate 218 is connected to a capacitor 134 which is connected to ground. Thus when the transfer gate 218 is activated, the voltage at the inverting input of the comparator 212 is the capacitor 134 voltage if the SHUTDOWN signal is not activated or ground if the system is in shut down.

The inverted control input of the transfer gate 218 receives the PG signal or internal power good signal, which is also inverted by an inverter 222 whose output is connected to the noninverted control input of the transfer gate 218. Thus in this manner when the power is good the transfer gate 218 is off, while when the power is bad the transfer gate 218 is activated. Therefore before the PG signal is high, that is, during power up, the capacitor 134 serves to set the undervoltage detection delay time.

The output of the inverter 222 is additionally connected to the inverted control input of a transfer gate 224, whose noninverted control input receives the PG signal. One through terminal of the transfer gate 224 is connected to the capacitor 134, while the other through terminal is connected to the output of a constant current source 226, which is connected to the $V_{DD}$ line to receive power. The constant current source 226 is also connected to the inverting input of a comparator 228 and to the drain of a n-channel enhancement MOSFET 230. The $V_{COMP}$ signal is provided to the noninverting input of the comparator 228. The source of the MOSFET 230 is connected to ground, while the gate is connected to the output of a two input NAND gate 232. The two input signals to the NAND gate 232 are the AUX and DB signals. Thus when the battery voltage is above the auxiliary battery voltage sense level and below the dead battery sense level, indicating the possible entry into auxiliary mode operation, the MOSFET 230 is turned off and the inverting input of the comparator 228 is not grounded. The transfer gate 224 is activated as the output voltage levels are adequate, so the capacitor 134 begins charging. However, when the voltage is above the dead battery level or at the auxiliary battery level, then the inverting input to the comparator 228 is grounded by the MOSFET 230. In this condition if the power is satisfactory as indicated by the PG signal, the capacitor 134 is also grounded. Thus during power good conditions the capacitor 134 is used to set the primary to auxiliary battery switchover delay time.

The output of the comparator 228 is provided to the input of an inverter 234. The output of the inverter 234 is provided to the input of a second inverter 236 and to the clocking input of a D-type flip-flop 238. The output of the inverter 236 is provided to the inverted clocking input of the flip-flop 238. The STARTUPB signal is provided to the inverted set input, while the D input is connected to ground. The STARTUPB signal connection is used to set the flip-flop 238 on start up so that the dead battery timing capabilities are available. The noninverted output of the flip-flop 238 is the DBSBAUX signal which, when high, generally indicates that the dead battery, standby and auxiliary mode is active.

The inverted reset input of the flip-flop 238 is provided by the output of a two input NAND gate 240. The DB signal is one input to the NAND gate 240, while the second input is the output of a two input NAND gate 242. One input to the NAND gate 242 is the PG signal, while second input is the output of an inverter 244. The input to the inverter 244 is provided by the output of a NOR gate 246 which has all of its inputs connected to the sources of two p-channel enhancement MOSFET transistors 248 and 250 and an n-channel enhancement MOSFET 252. The drains of the MOSFET's 248 and 250 are connected to the $V_{DD}$ line. The PG signal is provided to the gate terminal of the MOSFET 248, while the DB signal is provided to the gate of the MOSFET 250. The PG signal is also provided to the gate of the MOSFET 252. The drain of the MOSFET 252 is connected to the source of an n-channel enhancement MOSFET 254 whose drain is connected to the STANDBY signal. The gate of the MOSFET 254 is connected to the DB signal. Thus the input to the NOR gate 246 is high if the power is not good or a dead battery condition is not present and if the system is in standby, the power is good and a dead battery condition is present. Therefore the flip-flop 238 is released from a reset condition when the primary battery 22 is not dead or the power is good and the system is in standby and the battery level is not at or below the dead threshold. If the battery 22 is dead; the power is not good; or the battery 22 is dead, the power is good and standby mode is not activated, the DBSBAUX signal is held low causing a shutdown condition. If the system has been in normal usage where the battery 22 has reached the dead battery voltage level, the power is good and standby mode is activated, when the auxiliary mode is entered before the capacitor 134 charges to a sufficient level, the DBSBAUX signal stays high. But if the auxiliary mode is not entered in a sufficient time the DBSBAUX signal is set low by clocking the flip-flop 238. The DBSBAUX signal can only be set to a high level by the STARTUPB signal being low, which only occurs during the start up phase after the power switch 42 has been closed. Thus to restart the DC-DC power supply 26 after a dead battery shutdown, the power switch 42 must be opened and closed.

Figure 6:
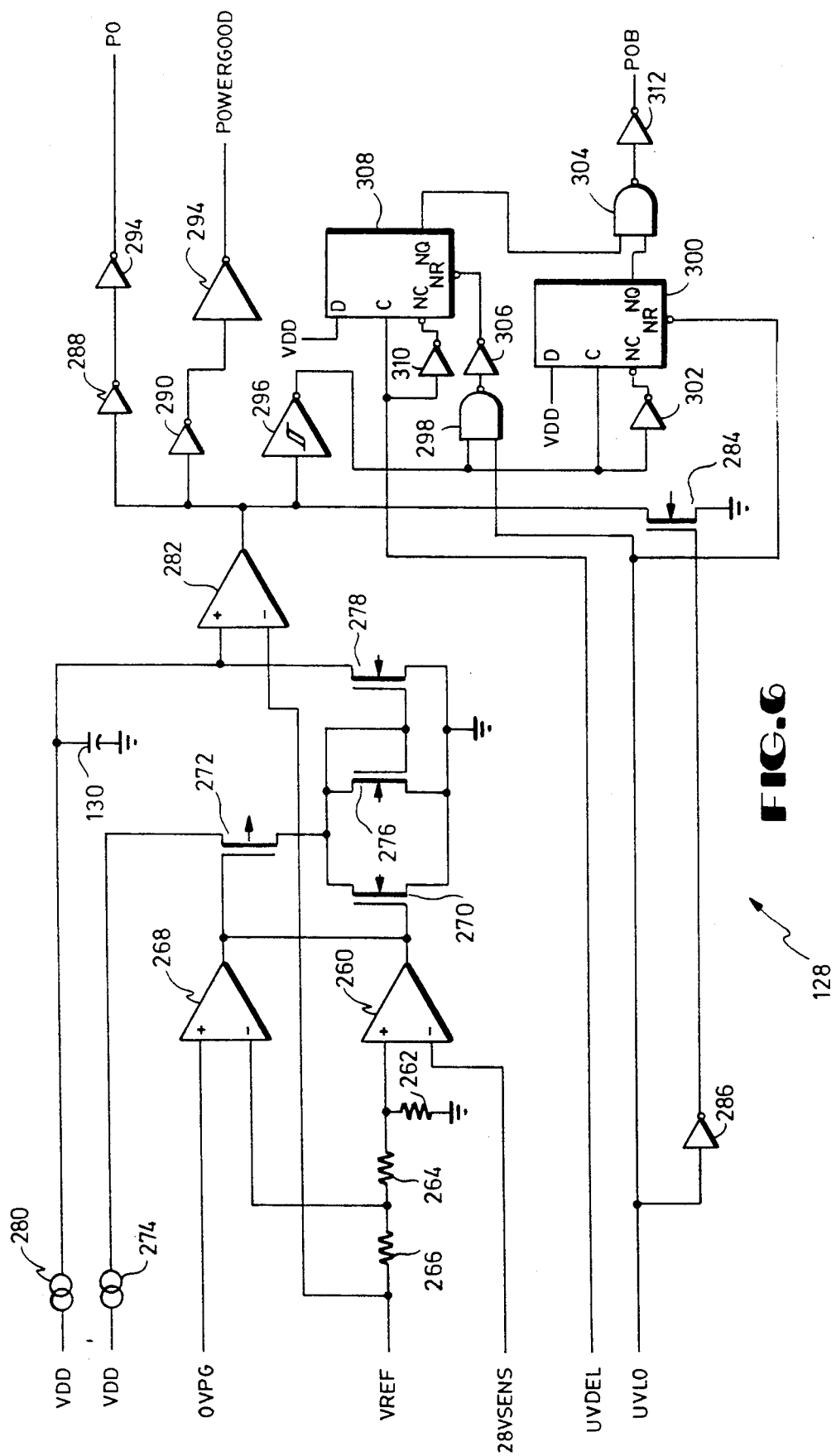
FIG. 6 is a schematic diagram of portions of the power good circuitry of FIG. 3.

The power good circuitry 128 is shown in more detail in FIG. 6. The 28VSENS signal is provided to the inverting input of a comparator 260. The noninverting input of the comparator is connected to one terminal of a resistor 262 whose other terminal is connected to ground. The noninverting input of the comparator 260 is further connected to one terminal of a resistor 264, whose second terminal is connected to a resistor 266 and to the inverting input of a second comparator 268. The second terminal of the resistor 266 receives the VREF signal. The OVPG signal, essentially the +5VSENS signal, is provided to the noninverting input of the comparator 268. The outputs of the comparators 260 and 268 are connected together and to the gates of an n-channel enhancement MOSFET 270 and a p-channel enhancement MOSFET 272. The drain of the MOSFET 272 is connected to the output of a constant current source 274 which is also connected to the $V_{DD}$ line for power. The source of the MOSFET 272 is connected to the drain of the MOSFET 270, the gate and drain of an n-channel enhancement MOSFET 276 and to the gate of an n-channel enhancement MOSFET 278. The sources of the MOSFETs 270, 276 and 278 are connected to ground. The drain of the MOSFET 278 is connected to the output of a constant current source 280, which receives its power from the $V_{DD}$ signal; to the noninverting input of a comparator 282 and to one terminal of a capacitor 130, whose other terminal is connected to ground. The inverting input of the comparator 282 is connected to the VREF signal. The capacitor 130 is the power good delay capacitor. Thus if the 5 volt output is too low or the magnitude of the $-28$ volt level is too low (that is, not sufficiently negative), the MOSFET 278 is turned on and the capacitor 130 is clamped to ground.

The output of the comparator 282 is connected to the drain of an n-channel enhancement MOSFET 284 whose source is connected to ground and whose gate is connected to the output of an inverter 286. The input of the inverter 286 receives the UVLO signal. In this manner if the UVLO signal is low, indicating a $V_{DD}$ undervoltage condition, the output of the comparator 282 is clamped to ground. After the undervoltage condition is cleared the comparator 282 output is released so that the voltage on the capacitor 130 determines the output of the comparator 282. The output of the comparator 282 is also provided to the inputs of two inverters 288 and 290. The output of the inverter 288 is provided to the input of an inverter 292 whose output is the PG signal. The output of the inverter 290 is provided to the input of a inverting buffer driver 294 whose output is the POWERGOOD signal.

Additionally, the output of the comparator 282 is provided to the input of a Schmidt trigger inverter 296 whose output is provided as one input of a 2 input NAND gate 298, to the clocking input of a D type flip-flop 300 and to the input of an inverter 302. The output of the inverter 302 is provided to the inverted clock input of the flip-flop 300. The D input of the flip-flop 300 receives the $V_{DD}$ or a positive signal level. The inverted reset input of the flip-flop 300 is connected to the UVLO signal. The inverted output of the flip-flop 300 is connected to one input of a 2 input NAND gate 304.

The UVLO signal is connected to the second input of the NAND gate 298, whose output is connected to the input of an inverter 306. The output of the inverter 306 is connected to the inverted reset input of a D type flip-flop 308. The UVDEL signal is provided to the clocking input of the flip-flop 308 and to the input of an inverter 306. The output of the inverter 310 is connected to the inverted clock input of the D type flip-flop 308. The D input is connected to a high voltage level. The inverted output of the flip-flop 308 is connected to the second input the NAND gate 304. The output of the NAND gate 304 is connected to the input of an inverter 312, whose output is the POB signal. Thus in this manner if the output voltage goes low at any time or if the voltage stays low past the undervoltage delay time, the POB signal is low and indicates that the power output is not acceptable and the DC-DC power supply 26 should be shutdown.

Figure 7:
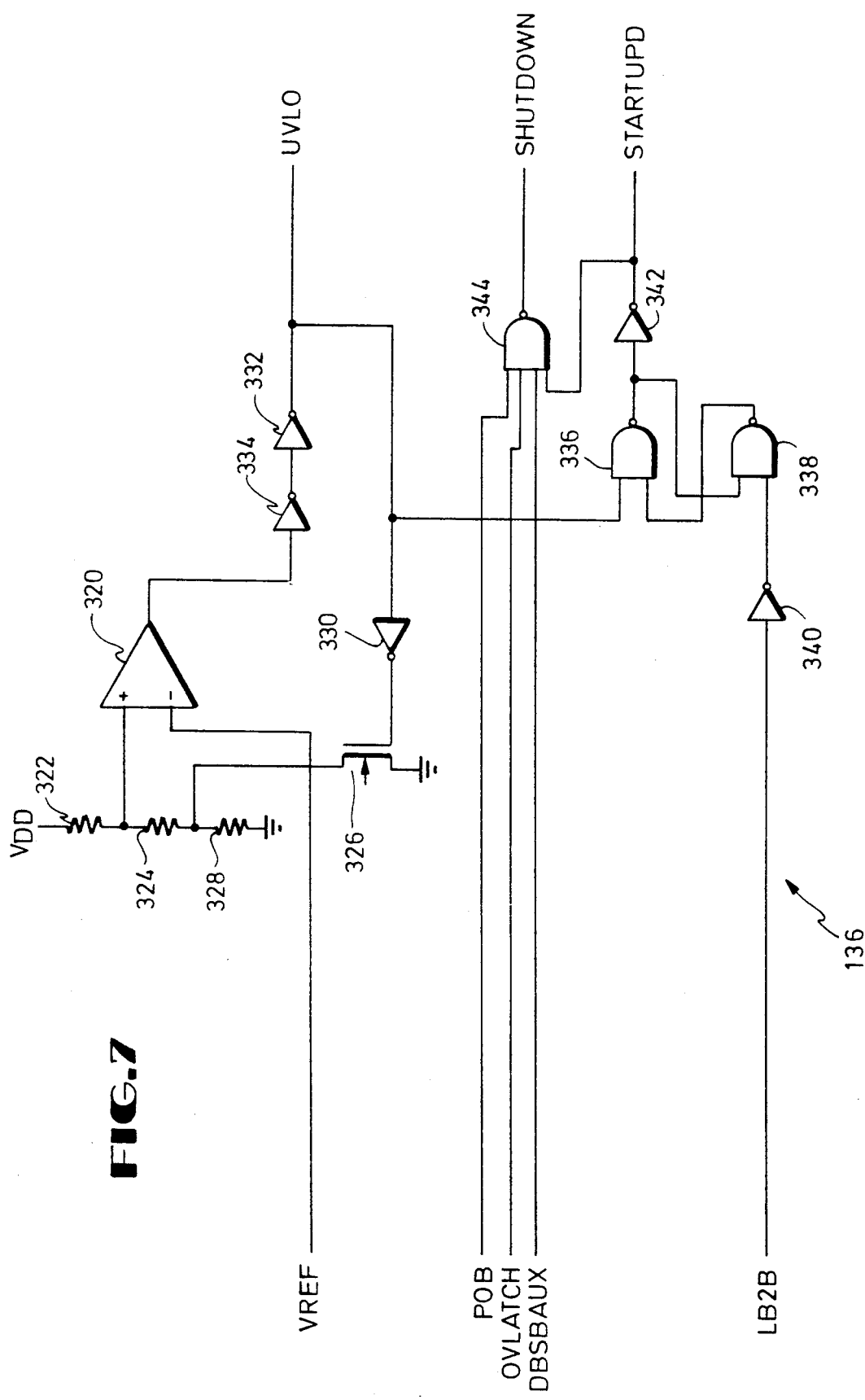
FIG. 7 is a schematic diagram of portions of the power up circuitry of FIG. 3.

Referring now to FIG. 7, the power up circuitry 136 is shown in more detail. The VREF signal is provided to the inverting input of a Comparator 320. The $V_{DD}$ signal is connected to one terminal of a resistor 322 whose second terminal is connected to the noninverting input of the comparator 320 and to one terminal of a resistor 324. The second terminal of resistor 324 is connected to the drain of an n-channel enhancement MOSFET 326 and to one terminal of a resistor 328. The second terminal of resistor 328 is connected to ground. The source of the MOSFET 326 is connected to ground, while the gate is connected to the output of an inverter 330. The input of the inverter 330 is connected to the output of an inverter 332, whose output is the UVLO signal. The input of the inverter 332 is connected to the output of an inverter 334, whose input is connected to the output of the comparator 320. Thus the UVLO signal is low until the $V_{DD}$ level has reached a satisfactory point as determined by the divider developed by the resistors 322 and 324, at which time the third resistor 328 is switched in to perform a feedback function.

The UVLO signal is additionally provided as one input to a 2 input NAND gate 336. The second input to the NAND gate 336 is provided by the output of a two input NAND gate 338. One input to the NAND gate 338 is provided by the output of an inverter 340 whose input receives the LB2B signal. The second input to the NAND gate 338 is provided by the output of the NAND gate 336. The output of the NAND gate 336 is provided to an inverter 342 whose output is the STARTUPB signal, which indicates that the battery voltage is acceptable to start operations and the local control voltage is satisfactory. The STARTUPB signal is provided as one input to a four input NAND gate 344 whose output is the SHUTDOWN signal. The other three inputs to the NAND gate 344 are the POB, OVLATCH and DBSBAUX signals. Thus the SHUTDOWN signal is low when the dead battery, auxiliary and standby condition is true, when a successful start has occurred, when the power is good and has not been over voltage.

Figure 8:
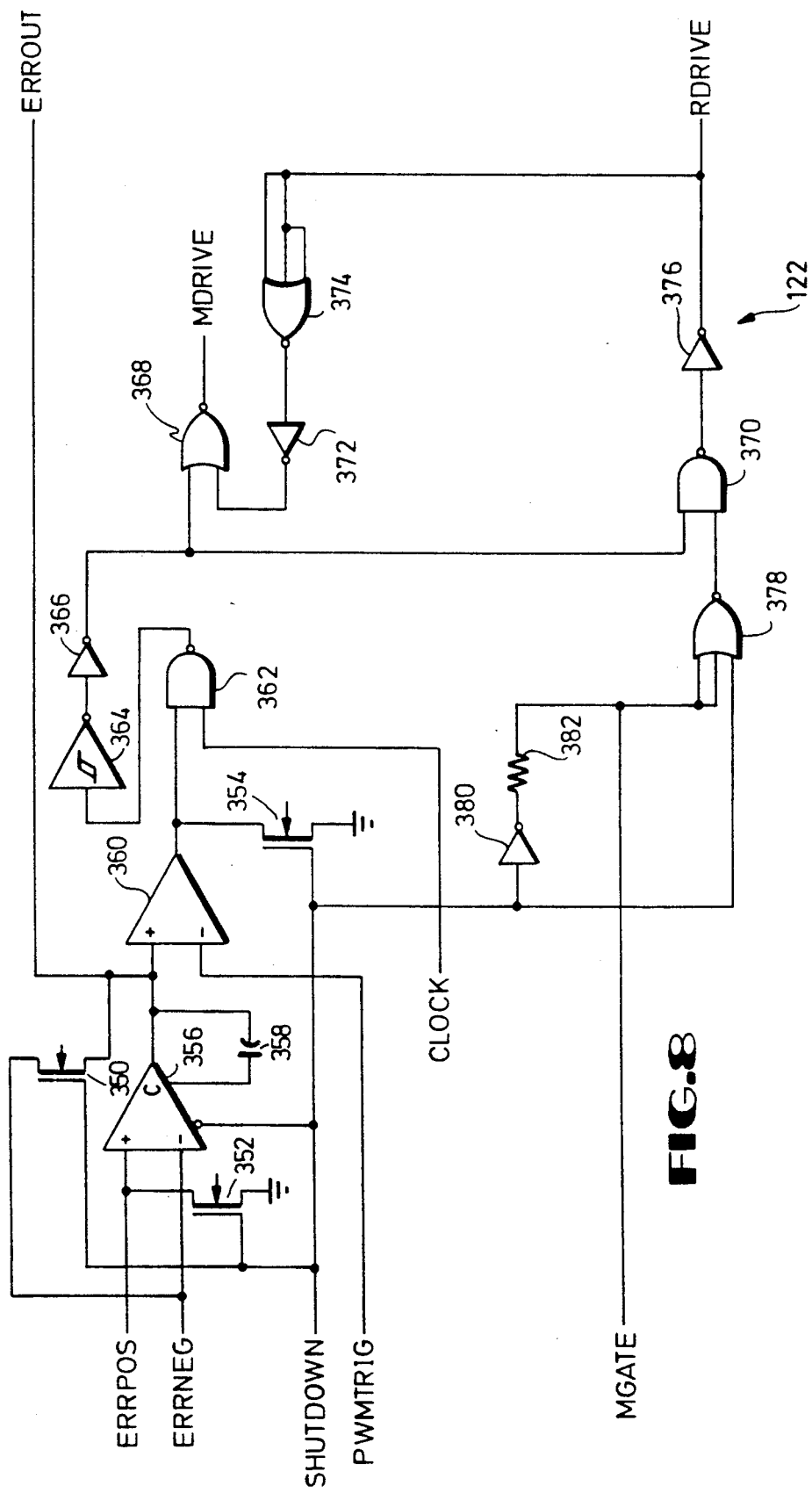
FIG. 8 is schematic diagram of portions of the pulse width modulation control circuitry of FIG. 3.

Referring now to FIG. 8, the PWM control module 122 is shown in more detail. The SHUTDOWN signal is provided to the gates of three n-channel enhancement MOSFET's 350, 352 and 354. The sources of the MOSFETS 352 and 354 are connected to ground, while the source of the MOSFET 350 is connected to the ERROUT signal, which is provided as the output of an operational amplifier 356. The ERRPOS signal is provided to the noninverting input of the amplifier 356 and to the drain of the MOSFET 352. The inverting input of the amplifier 356 receives the ERRNEG signal and the source of the MOSFET 350. Thus if the SHUTDOWN signal is high the two inputs to the amplifier 356 are clamped. A capacitor 358 is provided to a compensation input of the amplifier 356 from its output. The SHUTDOWN signal is also provided as a control input to the amplifier 356 to allow its internal operations to be shutdown.

The output of the amplifier 356 is provided to the noninverting input of a comparator 360, with the inverting input receiving the PWMTRIG signal. The output of the comparator 360 is connected to the drain of the MOSFET 354 and to one input of a two input NAND gate 362. Thus the output of the comparator 360 is clamped to ground during shutdown. The second input to the NAND gate 362 receives the CLOCK signal. The output of the NAND gate 362 is provided to a Schmidt trigger inverter 364 whose output is connected to an inverter 366. The output of the inverter 366 is connected to one input of a two input NOR gate 368 and to one input of a two input NAND gate 370. The output of the NOR gate 368 is the MDRIVE signal, with the second input being connected to the output of an inverter 372. The input to the inverter 372 is connected to the output of a three input NOR gate 374 configured as an inverter. The inputs to the NOR gate 374 are provided by the output of an inverter 376 whose output is referred to as the RDRIVE signal. The input to the inverter 376 is provided by the output of the NAND gate 370. The second input to the NAND gate 370 is provided by the output of a three input NOR gate 378. The SHUTDOWN signal is provided as one input to the NOR gate 378, while the MGATE signal is provided to the other two inputs. Additionally the SHUTDOWN signal is provided to the input of an inverter 380, whose output is connected to one terminal of a resistor 382, whose second terminal is connected to the MGATE signal and thus to the two inputs of the NOR gate 378. Thus when the SHUTDOWN signal is received, the MDRIVE and RDRIVE signals are clamped in a low state, thus disabling the switching power supply transistors 84 and 90, so that +5 volts is no longer developed by the DC-DC power supply 26 and it is thus shut down.

Thus to recap operation, if the computer 28 is in standby mode and the primary battery 22 is removed, the DB signal is developed, and assuming the power is good, a window for the timing delay commences. However, the capacitor 134 will not charge because the AUX signal will be low, the V$_{BATT}$ line being at the auxiliary battery 24 level. Therefore the flip-flop 238 will not get clocked and the DBSBAUX signal will stay high. However, if the primary battery 22 is simply discharging and its output voltage has dropped below the dead battery level, the timing will commence upon crossing the threshold and the AUX signal will remain high, thus allowing the capacitor 134 to charge, eventually clocking the flip-flop 238 and setting the DBSBAUX signal low, which in turns causes the SHUTDOWN signal to go high, shutting off the PWM control module 122.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

I claim:

1. An auxiliary battery operation circuit for use in a system having an operating voltage provided by a higher voltage primary battery and a lower voltage auxiliary battery, the circuit comprising:

means for determining if the operating voltage is below a given level indicating a discharged state of the primary battery, wherein said given level is greater than the voltage level of the auxiliary battery;

means for determining if the operating voltage is above the auxiliary battery voltage;

means coupled to said primary battery discharged state determining means for timing entry into said discharged state; and means coupled to said discharged state timing means and said auxiliary battery operating voltage determining means for determining if said operating voltage level becomes the auxiliary battery voltage before said discharged state timing means indicates a predetermined time, and if so, indicating auxiliary battery operation, wherein said auxiliary battery operation indication means indicates auxiliary battery operation past said predetermined time.

2. The circuit of claim 1, wherein the system further has a low power operating mode and provides a signal indicating activation of such low power mode and wherein said auxiliary battery operation indication means receives said low power mode activation signal and overrides the indication of auxiliary battery operation past said predetermined time if the system is not in low power mode at said predetermined time.

3. The circuit of claim 1, wherein if said operating voltage level is above the auxiliary battery voltage when said discharged state timing means indicates said predetermined time, said auxiliary battery operation indication means indicating a shutdown of operations of the system.

4. A power supply for a system having an operating voltage provided by a higher voltage primary battery and a lower voltage auxiliary battery, the power supply comprising:

means coupled to the primary and auxiliary batteries to receive the operating voltage for producing a DC output voltage from the operating voltage, said DC output voltage means including an input for receiving a signal requesting cessation of providing said DC output voltage from said DC output voltage means and being responsive to said input signal to cease providing said DC output voltage;

means for determining if the operating voltage is below a given level indicating a discharged state of the primary battery, wherein said given level is greater than the voltage of the auxiliary battery;

means for determining if the operating voltage is above the auxiliary battery voltage;

means coupled to said primary battery discharged state determining means for timing entry into said discharged state; and means coupled to said discharged state timing means and said operating voltage determining means for determining if said operating voltage level becomes the auxiliary battery voltage before said discharged state timing means indicates a first predetermined time, and if so, providing a signal indicating continuation of providing said DC output voltage wherein said signal is provided past said first predetermined time, said signal coupled to said DC output voltage means cessation input.

5. The power supply of claim 4, wherein the system further has a low power operating mode and provides a signal indicating activation of such low power mode and wherein said auxiliary battery operation indication means receives said low power mode activation signal and indicates continuation of providing said DC output voltage only if the system is in low power mode at said first predetermined time.

6. The power supply of claim 5, further comprising:

means coupled to said DC output voltage for determining if the level of said DC output voltage is within satisfactory voltage levels; and wherein said auxiliary battery operation indication means is coupled to said DC output voltage satisfactory voltage level means and indicates continuation of providing said DC output voltage only if said DC output voltage is within satisfactory voltage levels at said first predetermined time.

7. The power supply of claim 4, further comprising:

means coupled to said DC output voltage for determining if said DC output voltage has exceeded a predetermined limit and, if so, providing a signal indicating cessation of providing said DC output voltage, said signal coupled to said DC output voltage means cessation input.

8. The power supply of claim 4, further comprising:

means coupled to said DC output voltage for timing a period after the power supply is powered up;

means coupled to said DC output voltage timing means and said DC output voltage for determining if said DC output voltage has exceeded a predetermined limit before said DC output voltage timing means has indicated a second predetermined time after the power supply is powered up, and if not, providing a signal indicating cessation of providing said DC output voltage, said signal coupled to said DC output voltage means cessation input.

9. The power supply of claim 8, further comprising:

means coupled to said DC output voltage for determining if said DC output voltage has exceeded a higher predetermined limit and, if so, providing a signal indicating cessation of providing said DC output voltage, said signal coupled to said DC output voltage means cessation input.

10. The power supply of claim 9, further comprising:

means for detecting initial activation of the power supply and determining if a predetermined voltage has been developed, and if not, providing signal indicating cessation of providing said DC output voltage, said signal coupled to said DC output voltage means cessation input.

11. The power supply of claim 10, wherein the system further has a lower power operating mode and provides a signal indicating activation of such low power mode and wherein said auxiliary battery operation indication means receives said low power mode activation signal and indicates continuation of providing said DC output voltage operation only if the system is in low power mode at said first predetermined time.

12. The power supply of claim 11, further comprising:
means coupled to said DC output voltage for determining if the level of said DC output voltage is within satisfactory voltage levels; and
wherein said auxiliary battery operation indication means is coupled to said DC output voltage satisfactory voltage level means and indicates continuation of providing said DC output voltage only if said DC output voltage is within satisfactory voltage levels at said first predetermined time.

13. The power supply of claim 4, further comprising:
means for detecting initial activation of the power supply and determining if a predetermined voltage has been developed, and if not, providing signal indicating cessation of providing said DC output voltage, said signal coupled to said DC output voltage means cessation input.

14. The circuit of claim 3, wherein if said operating voltage level is above the auxiliary battery voltage when said discharged state timing means indicates said first predetermined time, said auxiliary battery operation indication means providing a signal indicating cessation of providing said DC output voltage, said signal coupled to said DC output voltage means cessation input.

* * * * *

UNITED STATES PATENT AND TRADEMARK OFFICE
CERTIFICATE OF CORRECTION

PATENT NO. : 5,177,371
DATED : January 5, 1993
INVENTOR(S) : Richard A. Faulk

Page 1 of 1

It is certified that error appears in the above-identified patent and that said Letters Patent is hereby corrected as shown below:

Column 15,
Line 8, delete "lower power" and insert therefore -- low power --.

Signed and Sealed this

Fifteenth Day of November, 2005

JON W. DUDAS
*Director of the United States Patent and Trademark Office*